Feb. 23, 1971 E. K. VON FANGE ET AL 3,566,277

SWITCH TUNER ASSEMBLY

Filed March 14, 1968 2 Sheets-Sheet 1

INVENTORS:
EUGENE K. VONFANGE,
SANJAR GHAEM-MAGHAMI,

BY Francis H. Boos, Jr.
THEIR ATTORNEY.

Feb. 23, 1971 E. K. VON FANGE ET AL 3,566,277
SWITCH TUNER ASSEMBLY
Filed March 14, 1968 2 Sheets-Sheet 2

INVENTORS:
EUGENE K. VONFANGE,
SANJAR GHAEM-MAGHAMI,
BY Francis H. Boos, Jr.
THEIR ATTORNEY.

United States Patent Office 3,566,277
Patented Feb. 23, 1971

3,566,277

SWITCH TUNER ASSEMBLY

Eugene K. Von Fange and Sanjar Ghaem-maghami, Chesapeake, Va., assignors to General Electric Company, a corporation of New York Filed Mar. 14, 1968, Ser. No. 713,047
Int. Cl. H03j *5/06, 5/26;* H04b *1/18*
U.S. Cl. 325—462 15 Claims

ABSTRACT OF THE DISCLOSURE

A wafer comprising a plurality of planar copper elements having characteristic inductances at high frequencies and coating a dielectric member and forming a continuum therewith is rigidly secured to a printed circuit board comprising a plurality of electronic components to form a tuner assembly. The plurality of the planar copper elements are fixedly connected to printed circuitry on the printed circuit board. The assembly is tuned by moving a rotary contact member to engage various pairs of silver plated contact elements associated with various pairs of the planar copper elements.

BACKGROUND OF THE INVENTION

This invention relates to a switch tuner assembly.

As commonly found in the art, the switch tuner comprises one or more stators or wafers supporting planar conductive elements forming various conductive patterns. Since each of the planar conductive elements possesses a characteristic inductance at high frequencies, which may be visualized as a conventional coil, the connection of these elements in various combinations will produce a variable or tunable inductance.

In the tuner industry, the switch tuner has long provided an inductively tuned alternative for the turret tuner, particularly in VHF tuners for television receivers. Yet, manufacturers of television receivers have generally preferred the turret tuner, a preference which is no doubt attributable to the somewhat superior performance of the turret tuner. Surprisingly enough, this preference exists in spite of the somewhat lower cost of the switch tuner.

Presumably, the switch tuner could be competitive with the turret tuner if the performance could be maintained at certain minimal and heretofore unattainable standards while sharply cutting costs on the tuner. However, the prior art has failed to achieve these simultaneous goals of improved performance and reduced cost. One reason for this overall inability may be attributed to the nonuse of printed circuit board techniques.

In general, the prior art has been unable to marry a wafer constructed by printed circuit board techniques with a printed circuit board carrying electronic components and printed circuitry or wiring. Although one form of the prior art has utilized a switch tuner wafer manufactured by certain printed circuit board techniques in combination with a printed circuit board carrying various electronic components, the wafer was rotatably mounted with respect to the circuit board thereby precluding a printed-circuit-to-printed-circuit interface. As a consequence, the introduction of additional discrete tuning inductors to supplement the wafer inductance was complicated and required the addition of inductors on the wafer itself. This of course greatly increased the cost of the overall tuner assembly since discrete components were secured to two separate printed circuit boards rather than one.

Furthermore, the rotatable nature of the wafers rendered a substandard tuner assembly performance. In particular, the wafer which included circular contact areas at the periphery required the use of long and narrow conductive elements within the confines of the circular contact area. Since the overall inductance of a long conductive segments of very narrow width is extremely sensitive to slight changes in that width, any slight inaccuracies in the printed circuit manufacturing techniques led to serious consequences in the performance of the tuner. Furthermore, the close spacing between the conductive elements necessitated by the confinement within the circular contact area led to undesirable mutual coupling which further affected the tuner performance.

SUMMARY OF THE INVENTION

It is a first object of this invention to achieve a switch tuner assembly with an improved standard of performance.

It is a further object of this invention to achieve an improved standard of performance and coincident cost saving.

In one embodiment of the invention, consistent with the above objectives, there is provided a switch tuner assembly including a support means carrying at least one electronic component. A wafer comprising a dielectric member carrying a plurality of planar conductive elements each of which has a characteristic inductance at high frequencies and which coat the dielectric member is secured to the support means thereby allowing a fixed connection of at least one of the planar conductive elements to the electronic component. The assembly further comprises a movably mounted contact means to variably connect the planar conductive elements thereby forming tuned circuits including the electronic component.

In further detail, the embodiment comprises a support means formed from a printed circuit board carrying a plurality of electronic components on one surface and printed circuitry on another surface.

BRIEF DESCRIPTION OF THE DRAWINGS

This specification concludes with claims particularly pointing out and distinctly claiming the subject matter which is regarded as the invention. The invention may also be understood from the following description taken in connection with the accompanying drawings in which:

DESCRIPTION OF THE PREFERRED EMBODIMENT

Figure 1:
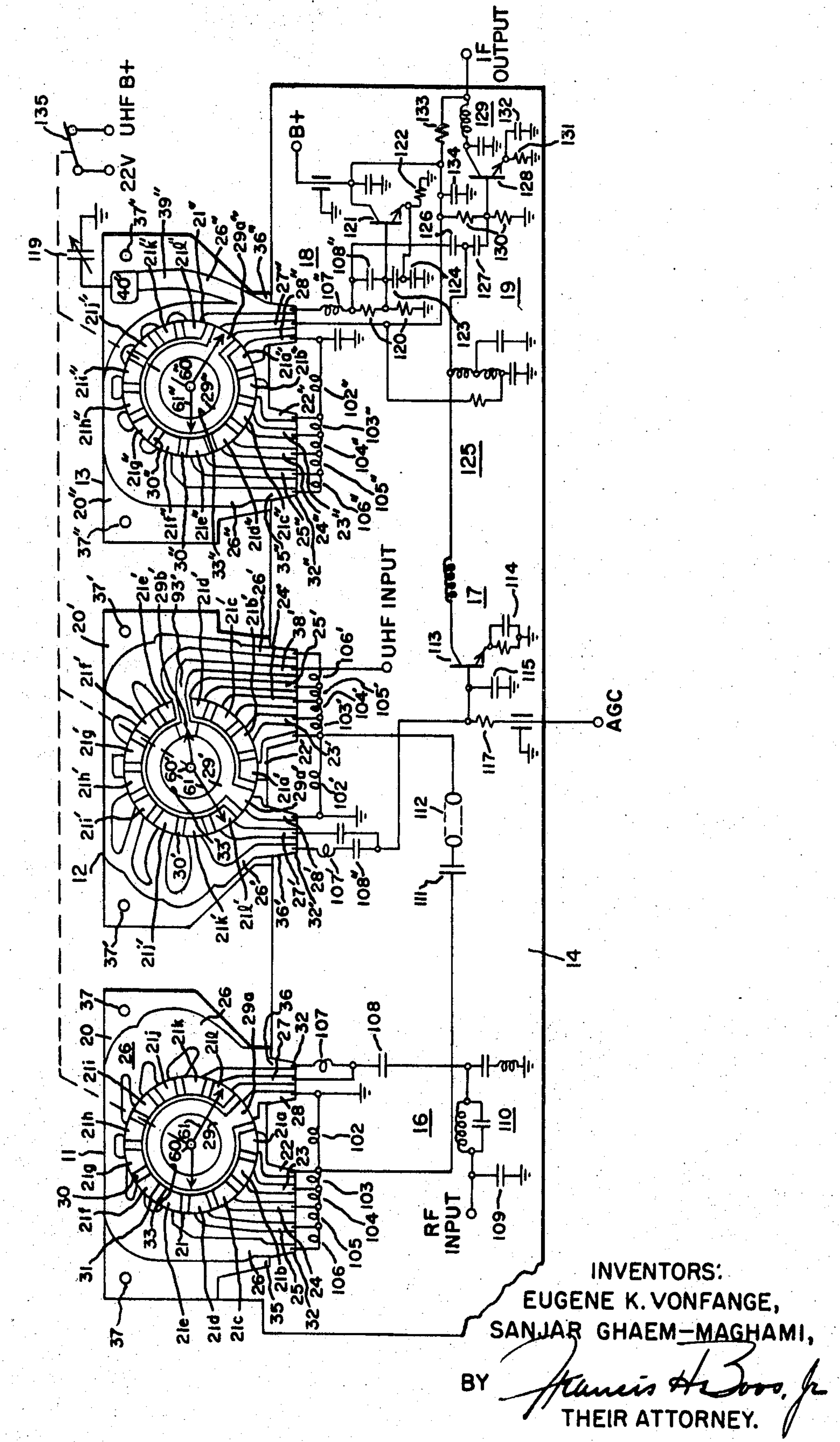
FIG. 1 is a hybrid schematic-elevation view of the tuner assembly.

As shown in FIG. 1, the tuner assembly comprises a plurality of tuning elements 11, 12, and 13 which are mounted directly on a support means comprising a printed circuit board 14. Each of the wafers 11, 12, and 13 comprise a distinct printed conductive pattern which serves to tune particular circuitry carried on the printed circuit board 14. In particular, the wafer 11 carries a printed conductive pattern which tunes an RF input circuit 16 mounted on the printed circuit board 14. Similarly, the wafer 12 comprises a conductive pattern which tunes an RF amplifier section 17 mounted on the printed circuit board 14. And finally, the wafer 13 comprises a conductive pattern which tunes a VHF oscillator section 18 also mounted on the printed circuit board 14. Both of the wafers 12 and 13 are coupled through the RF amplifier section 17 and the VHF oscillator section 18 respectively to a converter section 19 also mounted on the printed circuit board 14.

In order to appreciate the benefits to be derived from marrying the printed tuning elements of the wafers 11, 12, and 13 with the printed circuitry carried by the printed circuit board 14, the precise nature of the wafers 11, 12, and 13 must be examined. The wafer 11 comprises a dielectric member 20 carrying an outermost arcuate or circular contact area 21 including silver plated series arrayed contact elements 21*a–k* corresponding to channels 3–13 and a contact element 21*l* corresponding to the UHF reception position. The plurality of contact elements 21*a–l* are connected to copper planar conductive elements 22–27 each of which has a characteristic inductance at high frequencies and which coat the dielectric member 20 of the wafer to form a continuum therewith. The wafer further comprises a second arcuate or circular contact area 29 comprising a silver plated contact element 29*a*, corresponding to channel 2, which is connected to a planar conductive element 28.

The tuning function of the wafer 11 is performed by variably connecting the contact area 29 to the contact elements 29*a* and 21*a–k* by movement of the rotor contact 61. The variable connection of the contact elements will in turn result in varying series inductor combinations of the grounded element 28 with the planar conductive elements 22–27, thus shunting those inductive elements which lie between the contact elements presently connected to contact area 29, and element 28.

As rotor contacts 61, 61' traverse contact elements 21*a*, 21*a'* it will be evident that the electrical path between the industive elements on wafer 11 and those on wafer 12, including channel absorption capacitor 111 and ferrite core 112, are shunted out of the tuned circuits which now comprise the inductive elements connected between the remaining contacts 21*b*–21*l* and 21*b'*–21*l'*. VHF signals are no longer passed by capacitor 111 and ferrite core 112 but are coupled from wafer 11 to wafer 12 by mutual inductance between corresponding elements of the printed circuits thereon, in the manner of a double-tuned circuit.

In order to achieve a printed-circuit-to-printed-circuit interface between the wafer 11 and the board 14, planar conductive elements 22–28 are positioned outside the circular contact area 21. Since the conductive elements 22–28 radiate toward the edges of the dielectric member 20, electronic components of the circuit board 14 including discrete tuning inductors 102, 103, 104, 105, 106, and 107, discrete tuning capacitors 108, 109, and an IF filter 110, may be connected to appropriate conductive elements on the wafer 11 by dip soldering. The intersection of the elements 22–28 with an imaginary line drawn tangent to the circular contact area 21 and parallel to the dielectric member edge 32 permits all electrical connection to be made in a single plane more clearly shown in FIGS. 2 and 3. As a result, several distinct benefits may be seen. First, the coupling of the RF input circuit to the wafer 11 is in itself simplified. Second, and perhaps most importantly, discrete tuning elements may supplement the tuning function of the wafer 11 without necessity for mounting those tuning elements on the wafer itself. Further benefits accrue from the positioning of the conductive elements 22–28 outside the circular contact area 21 as set forth in copending application, Ser. No. 713,234, filed Mar. 14, 1968 assigned to the assignee of the present invention.

Wafer 11 further includes a number of features which adapt it for use in the assembly. These features include silver plated isolating islands 30 positioned in voids 31, to prevent mutual coupling in the contact area 21 while also providing contamination of contacts 61 by the dielectric member 20. This is the subject matter of a copending application, Ser. No. 713,046, filed Mar. 14, 1968, assigned to the assignee of the present invention. These features also include a central aperture 33 which will receive the rotor shaft 60 carrying the contact 61, a pair of legs 35 and 36 which are inserted through the circuit board 14, and a pair of apertures 37 which receive assembly mounting rods for securing the wafer 11 in place.

The wafer 12, which is substantially a mirror image of the wafer 11, is also coupled to the printed circuit board 14 at a printed-circuit-to-printed-circuit interface. Since the wafer 12 is similar to the wafer 11, the elements of the wafer 12 are shown with element numbers corresponding to the element numbers of the wafer 11 primed. In addition, the corresponding discrete tuning elements carried by the circuit board 14 are also primed.

However, the wafer 12 is sufficiently different from the wafer 11 so as to provide a unique tuning function at the RF amplifier section 17. More specifically, the wafer 12 is designed to tune an amplifier comprising a transistor 113, a parallel RC emitter combination 114, a blocking capacitor 115, and a series RC AGC coupling combination 117. The wafer 12 further differs from the wafer 11 in providing UHF coupling means to the amplifier section 17. These means include the addition of a contact element 29*b'* which is connected to a planar conductive element 38' through a silver plated segment 93. As a result, the amplifier section 17 may pass UHF signals coupled through the printed-circuit-to-printed-circuit interface of the wafer 12, or it may operate on a VHF signal coupled from the elements disposed on wafer 11 to those on wafer 12 by mutual inductance. Channel frequency absorption capacitor 111 an image rejection ferrite core 112 provide additional coupling when rotor contacts 61, 61' are dispose on contact elements 29*a* and 29*a'* which correspond to channel 2.

The wafer 13 which is capable of yet another tuning function, tuning of the oscillator section 18, is also coupled to the printed circuit board 14 at a printed-circuit-to-printed-circuit interface. In the case of the wafer 13, all element numbers of the wafer 13 which correspond to element numbers of the wafer 11 are double primed. Similarly, the discrete tuning elements of the wafer 13 which correspond to similar discrete tuning elements of the wafer 11 are double primed.

Once again, the precise wafer design is dictated by the tuning function to be performed. In this case, the wafer 13 is designed to tune an oscillator section 18 which comprises particular circuitry requiring particular tuning means. The particular circuitry includes a transistor 21 with a series base-biasing resistor combination 120 connected to the B+ through the planar conductive element 27'' and an emitter biasing resistor 122. The circuitry further includes a feedback capacitor 123 and a leak off capacitor 124. An additional design feature is dictated by the necessity for a fine tuning means. In particular, the fine tuning means comprises a variable capacitor 119 connected to an additional planar conductive element 39'' at a contact point 40''.

In order to convert the RF output of the RF amplifier 113 to an IF signal, the output from the collector of the transistor 113 and the output from the oscillator section 18 are coupled to the converter section 19. The RF signal coupling is effected through a compromise matching network 125 and a coupling capacitor 127. The oscillator output signal is coupled to the converter section 19 through an injection capacitor 126 and the coupling capacitor 127. Both signals are then applied to the base of the converter transistor 128.

In addition to the transistor 128, the converter section 19 also includes a series resistor biasing combination 130 connected to the base of the transistor 128 and the B+ power supply. The bias circuitry for the transistor 128 also includes an emitter resistor 131 shunted by a by-pass capacitor 132 and a collector resistor 133 shunted by a blocking capacitor 134. The IF output of the transistor 128 is taken at the collector through an IF tuned circuit 129.

As shown in FIG. 1, the rotor contacts 61, 61', and 61'' are not only ganged to permit VHF channel selection, but they are also ganged with a UHF switch 135 to prepare the tuner assembly for reception of UHF signals. In the position shown, the B+ supply is presently disconnected from the base of the transistor 121 due to the position of the rotor contact 61''. As a result, the oscillator is cut off while the RF input is grounded so as to pass only the IF signal from the UHF tuner through the amplifier section 17 to the converter section 19.

Figure 3:
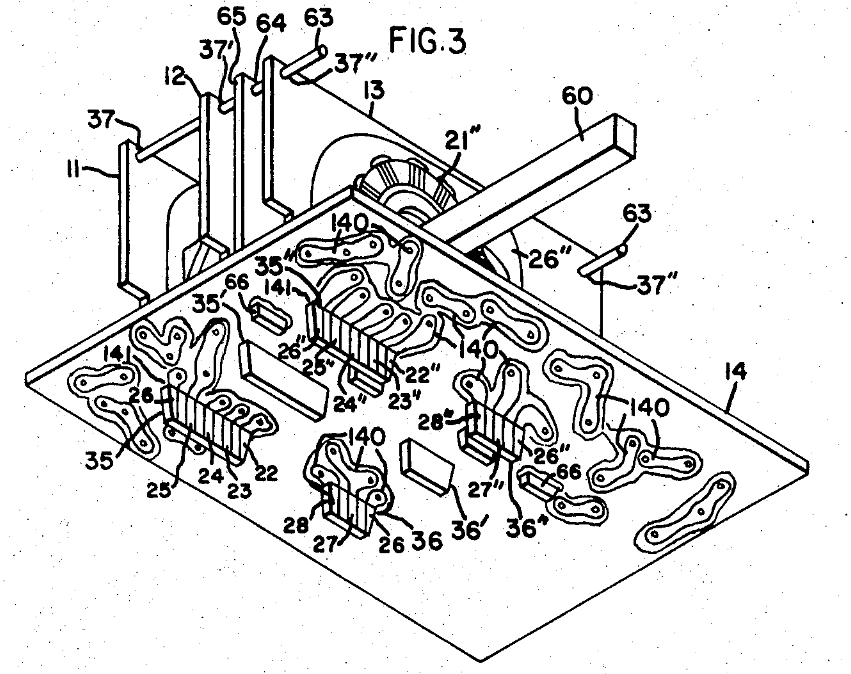
FIG. 3 is a perspective view below the switch tuner assembly of FIG. 2.
Figure 2:
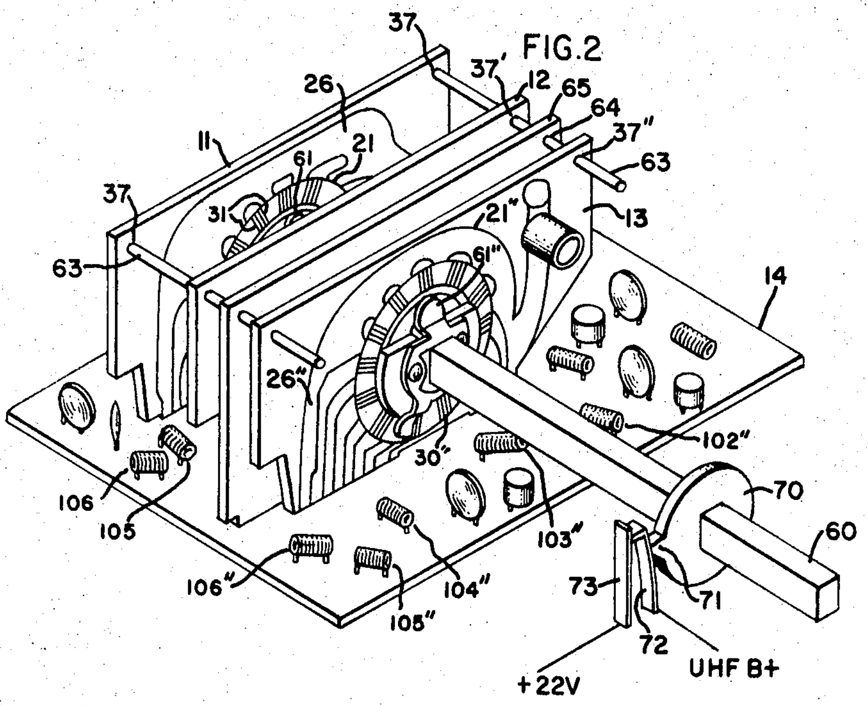
FIG. 2 is a perspective view above the switch tuner assembly.

In order to demonstrate the ease of connecting the wafers 11, 12, and 13 to the circuit board 14, the tuner assembly is shown in FIGS. 2 and 3. In those figures, it may be seen that the plane of the printed circuit board 14 will intersect the conductive elements on the wafers 11, 12, and 13. Consequently, the printed circuits 140 which interconnect the electronic components including the discrete tuning elements 102–108, 102'–108', and 102''–108'' may be soldered simultaneously. The net result is a plurality of printed-circuit-to-printed-circuit interfaces 141.

In order to maintain a certain rigidity along the interfaces 141, the legs 35, 36, 35', 36', 35'', 36'' are inserted through apertures in the circuit board 14. Additional support is provided by inserting rods 63 through apertures 37, 37', and 37''. The rods 63 also pass through apertures 64 in the conductive shield 65 which is positioned between wafers 12 and 13. Further support for the shield 65 is achieved by inserting tabs 66 through apertures in the circuit board 14 and soldering the tabs in place.

The actual tuning of the assembly is effected by rotation of shaft 60 carrying the rotor contact members 61, 61', and 61'' for each wafer 11–13. In addition to the contact members 61, 61', and 61'', the shaft 60 carries a cam 70 with a camming surface 71. When the shaft 60 is rotated to the position shown which corresponds to the UHF band or channel 1 position, the contact 61 will engage contact elements 29, 29', 29'' and 211, 211', 211'' and the camming surface 71 will force the switch member 72 of the UHF B+ switch 135 to contact a conductive member 73 maintained at a potential of 22 volts. The switch 135 may be supported on the assembly by means not shown but well known in the art.

In the foregoing, the description has been directed to wafers particularly adapted for use in VHF tuners in a UHF-VHF television receiver environment. This has been done since it is believed that a low cost tuner which renders a high performance is particularly suitable for today's television market. However, the tuner is equally useful in any market wherein a good tuner at reduced cost is required.

Although specific embodiments of the invention have been shown, it is not desired that the invention be limited to any particular form shown, and it is intended by the appended claims to cover all modifications within the spirit and scope of the invention.

What is claimed as new and desired to be secured by Letters Patent of the United States is:

1. A switch tuner assembly comprising:

support means including printed circuitry and at least one electronic component;

a wafer including a dielectric member and a plurality of planar conductive elements having characteristic inductances at high frequencies and coating said member and forming a continuum therewith, at least one of said planar conductive elements being rigidly affixed to said printed circuitry;

tunable circuit means including a plurality of circuit elements, each of said circuit elements having a characteristic inductance, at least one of said circuit elements consisting of one of said planar conductive elements; and contact means movably mounted with respect to said wafer and said support means to variably connect said planar conductive elements to form a tuned circuit.

2. The switch tuner assembly of claim 1 wherein said support means comprises two surfaces, a first of said two surfaces carrying said at least one electronic component and a second of said two surfaces carrying said printed circuitry.

3. The switch tuner assembly of claim 2 wherein said plurality of planar conductive elements and said at least one electronic component are electrically connected to said printed circuitry in a single plane by a plurality of solder connections.

4. The switch tuner assembly of claim 3 wherein said support means includes a plurality of electronic components, certain of said electronic components being electrically connected to certain of said planar conductive elements to form additional discrete tuning elements.

5. A switch tuner assembly of claim 4 wherein certain of said electronic components comprise discrete inductors, each of said inductors being connected between two of said planar conductive elements.

6. The switch tuner assembly of claim 5 wherein certain of said electronic components comprise at least one transistor, said wafer and said discrete tuning elements forming a tuned circuit coupled to said transistor.

7. The switch tuner assembly of claim 1 wherein said wafer includes a contact area comprising a plurality of contact elements individually connected to said planar conductive elements and serially arranged to coincide with the path of movement of said contact means.

8. The switch tuner assembly of claim 7 wherein said contact area is substantially arcuate and said contact means are rotatably mounted with respect to said wafer so as to sweep out an arcuate path.

9. The switch tuner assembly as recited in claim 8 wherein a plurality of said planar conductive elements lie outside the locus of radii of said arcuate contact area.

10. The switch tuner assembly of claim 9 wherein said contact area is substantially circular and all of said planar conductive elements lie outside said contact area.

11. The switch tuner assembly of claim 10 wherein said planar conductive elements are intersected by the plane of said circuit board.

12. The switch tuner assembly of claim 11 wherein all of said plurality of planar conductive elements are soldered to said printed circuitry.

13. The switch tuner assembly of claim 12 wherein said circuit board comprises two parallel surfaces, the first of said surfaces carrying a plurality of electronic components including discrete tuning elements, a second of said surfaces carrying printed circuitry electrically connected to said plurality of electronic components, certain of said discrete tuning elements connected between certain of said planar conductive elements by solder connections between said printed circuitry and said planar conductive elements.

14. The switch tuner assembly as recited in claim 13 wherein said wafer is inserted through one or more apertures in said circuit board.

15. A switch tuner assembly comprising:

support means including printed circuitry and at least one electronic component;

a plurality of wafers, each of said wafers including a dielectric member and a plurality of planar conductive elements having characteristic inductances at high frequencies and coating said members and forming a continuum therewith, at least one of said planar conductive elements of each of said wafers being rigidly affixed to said printed circuitry;

first and second tunable circuit means, each of said tunable circuit means comprising a plurality of circuit elements, each of said circuit elements having a characteristic inductance, at least some of said circuit elements consisting of one of said planar conductive elements, the planar conductive elements of said first and said second tunable circuit means being disposed on adjacent wafers for providing reactive coupling between said first and said second tunable circuit means; and contact means movably mounted with respect to said wafers and said support means to variably connect said planar conductive elements to form tuned circuits.

References Cited

UNITED STATES PATENTS

| | | | |
|---|---|---|---|
| 2,789,212 | 4/1957 | Achenbach | 334—56 |
| 3,029,367 | 4/1962 | Tomonoh | 317—101C |
| 3,327,072 | 6/1967 | Willmann | 200—14 |

OTHER REFERENCES

Towers, T. D.: Transistor Television Receivers, New York, John F. Rider Publisher, Inc., ©1963.

RICHARD MURRAY, Primary Examiner

H. W. BRITTON, Assistant Examiner

U.S. Cl. X.R.

317—101; 325—452, 459, 461; 334—56, 85